United States Patent [19]

Arai et al.

[11] Patent Number: 5,358,032

[45] Date of Patent: Oct. 25, 1994

[54] LSI PACKAGE COOLING HEAT SINK, METHOD OF MANUFACTURING THE SAME AND LSI PACKAGE TO WHICH THE HEAT SINK IS MOUNTED

[75] Inventors: Masatsugu Arai; Akiomi Kohno, both of Ibaraki; Toshio Hatada, Tsuchiura; Yoshihiro Kondo, Hadano; Toshihiro Komatsu, Ibaraki; Kanji Otsuka, Higashiyamoto; Yuji Shirai, Kodaira; Susumu Iwai, Hadano, all of Japan

[73] Assignee: Hitachi, Ltd., Tokyo, Japan

[21] Appl. No.: 13,423

[22] Filed: Feb. 4, 1993

[30] Foreign Application Priority Data

Feb. 5, 1992 [JP] Japan .................................. 4-019786

[51] Int. Cl.⁵ .............................................. F28F 7/00
[52] U.S. Cl. ........................... 165/80.3; 165/185; 174/16.3; 257/722; 361/690; 361/703
[58] Field of Search .............. 165/80.3, 185; 361/382, 361/383, 385, 386, 690, 703, 704; 257/713, 721, 722; 174/16.3

[56] References Cited

U.S. PATENT DOCUMENTS

| | | | |
|---|---|---|---|
| 2,112,743 | 3/1938 | Poole | 165/185 |
| 3,694,699 | 9/1972 | Snyder et al. | 174/16.3 |
| 4,408,255 | 10/1983 | Adkins | 361/382 |
| 4,858,072 | 8/1989 | Chall, Jr. | 361/388 |
| 5,180,001 | 1/1993 | Okada et al. | 361/386 |
| 5,195,576 | 3/1993 | Hatada et al. | 165/80.3 |

FOREIGN PATENT DOCUMENTS

| | | | |
|---|---|---|---|
| 49791 | 4/1982 | European Pat. Off. | 257/720 |
| 154630 | 8/1985 | Japan | 257/720 |
| 250755 | 11/1991 | Japan | 257/713 |

OTHER PUBLICATIONS

Panaro, M. C., "Heat Conducting Vibration and Shock Mount", IBM Tech. Discl. Bull., vol. 7, No. 1, Jun. 1964, p. 113.
Donegan, M. J. et al "Heat Conducting Washer", IBM Tech. Discl. Bull., vol. 8, No. 1, Jun. 1965, p. 206.
Ronkese, B. J. "Metal Wool Heat Stud", IBM Tech. Discl. Bull, vol. 20, No. 3, Aug. 1977, pp. 1122–1123.
Christensen, R. G. "Heat Transfer Pad" IBM Tech Discl. Bull., vol. 22, No. 12, May 1980, pp. 5307–5308.

*Primary Examiner*—John Rivell
*Assistant Examiner*—L. R. Leo
*Attorney, Agent, or Firm*—Antonelli, Terry, Stout & Kraus

[57] ABSTRACT

Disclosed is an LSI package cooling heat sink having a heat diffusion plate and thin wire fins joined to the heat diffusion plate. The heat sink is mounted on an LSI package and the LSI package is cooled by the flowing of fluid through the thin wire fins. The wire fins are made of a net formed of longitudinal thin wires intersecting with horizontal thin wires. The net is formed to continuous rectangular shapes or a swirl shape and joined to the heat diffusion plate. The net is constituted so that the number of the thin wires vertical to the heat diffusion plate is larger than the number of the thin wires parallel thereto and the net is joined to the heat diffusion plate by brazing, diffusion joint, pressure welding or the like. Since the heat sink is formed of the net composed of the longitudinal thin wires intersecting with the horizontal thin wires, the irregular portions of the adjacent thin wires are formed at a dislocated position and fluid striking against the thin wires produces many turbulent flows so that a high heat transfer performance can be obtained. Further, since the net formed of the thin wires is used, the size of cooling fins can be reduced and noise can be also lowered. Further, it is possible to produce an LSI package cooling heat sink in a short time which heat sink is excellent in mass-production.

10 Claims, 7 Drawing Sheets

LSI PACKAGE COOLING HEAT SINK, METHOD OF MANUFACTURING THE SAME AND LSI PACKAGE TO WHICH THE HEAT SINK IS MOUNTED

BACKGROUND OF THE INVENTION

1. Field of the Invention

The present invention relates to a heat sink for cooling LSI packages having various structures used to cool electronic apparatuses typically represented by computer systems, a method of manufacturing the same and an LSI package to which the heat sink is mounted, and more specifically, to a structure of a heat sink having fins attached to a heat diffusion plate and a method of manufacturing the same.

2. Description of the Related Art

Conventionally, LSI chips have a heat generating density ranging from about several watts/cm$^2$ to about several tens of watts/cm$^2$ and thus an LSI package including LSI chips packed therein can be cooled by supplying air flow thereto or a simple arrangement in which a flat plate with a good heat radiating property is disposed on the backside of the LSI package. Recently, however, as an amount of heat generated by LSI chips is increased, heat sink structures excellent in cooling performance are needed.

Among them, a pin-fin shaped heat sink structure may be contemplated as a preferable structure when both the advantageous mounting and the improvement of heat radiating performance are taken into consideration. As disclosed in Japanese Unexamined Patent Publication No. Hei 3-250652, there is a heat sink composed of thin wires whose diameter is selected so that the Reynolds number thereof is 40 or less, as an example using the above structure.

The LSI package cooling heat sink is composed of thin wire fins made by bending a continuous long metal (Cu) wire and joining the same to a heat diffusion plate.

Further, there is another heat sink arranged such that thin wire fins joined to be wide wire-shaped members or support columns spaced apart from each other at predetermined intervals are processed to a corrugate shape and then joined to a heat diffusion plate through metal, and the like to improve the rigidity of the heat sink.

In these prior art LSI package cooling heat sinks, when the thin wires fins are processed to a corrugate shape or while they are handled, these wires fins are irregularly located or not formed to a uniform shape due to the low rigidity of the thin wire fins regardless of that the wide wire-shaped members or support columns are provided at predetermined intervals to improve the rigidity of the heat sink. As a result, the respective heat sinks or products are apt to have a varying performance and thus are less reliable.

Further, the thin wire fins must be carefully bent to the corrugate shape because the thin wires are less rigid. Therefore, a long time is needed to bend the thin wire fins to the corrugate shape.

Further, when the thin wire fins are joined to the heat diffusion plate, a joining surface is deformed due to the lack of rigidity of the thin wire fins. As a result, the thin wire fins do not come into intimate contact with the heat diffusion plate and are not joined well thereto, and thus a problem arises in that a cooling performance is lowered.

Further, a problem also arises in that a discharged cooling wind has a pressure lower than that of a changed cooling wind (hereinafter, referred to as a pressure loss) due to the existence of the wide wire-shaped members or support columns provided with the thin wire fins to improve the rigidity thereof and thus a cooing effect is lowered. That is, the design of the heat sink does not take the flow and cooling performance of a cooling wind into consideration.

Further, since the thin wire fins are formed to a uniform shape, the temperature of the thin wire portion located just above a heat generating portion (LSI chip) is greatly increased as compared with that of the other thin wire portion and thus the thin wires of the former portion may be oxidized, which causes a problem from a view point of reliability in a long term. Moreover, in this LSI package cooling heat sink, the heat diffusion plate is irregularly heated and a heat resistance is increased.

SUMMARY OF THE INVENTION

An object of the present invention into provide an LSI package cooling heat sink including a rigid air-cooling type heat sink structure excellent in a cooling performance, a method of manufacturing the same and an LSI package on which the heat sink is mounted.

To achieve the above object, according to the present invention, fins are composed of a net made of longitudinal thin wires intersecting with horizontal thin wires so that the fins are not dislocated by the lack of rigidity of the thin wires and so that the heat sink as well as a cooling performance are improved. Further, the net is continuously bent to a rectangular shape or swirl shape by plastic working to improve a cooling efficiency. Further, a net is used in which the number of thin wires parallel to a heat diffusion plate is smaller than that of thin wires vertical thereto to form rectangular meshes so that the pressure of a cooling wind is not lowered. Further, the heat sink is formed more densely at the central portion thereof than at the periphery thereof so that the heat diffusion plate has a uniformly distributed temperature when it is cooled.

On the other hand, the high reliability of a joined portion can be achieved by soldering, brazing or pressure welding. Further, this is also achieved by the joint made by using aluminium-silicon as a brazing material.

The LSI package cooling heat sink and the method of manufacturing the same include any of the following features:

(1) a plate-shaped net is used as fins and one end of the plate-shaped net is joined to a heat diffusion plate;
(2) the plate-shaped net is bent to form continuous rectangular shapes in item (1);
(3) the plate-shaped net is bent to form continuously repeated triangular shapes on the heat diffusion plate in item (1);
(4) the plate-shaped net is formed to a swirl-shape in item (1);
(5) the net is composed of longitudinal thin wires intersecting with horizontal thin wires to form a continuous rectangular plate member as a whole in item (1);
(6) the net is composed of longitudinal thin wires intersecting with horizontal thin wires to form a swirl-shaped plate member as a whole in item (1);
(7) the net is arranged such that the number of the thin wires parallel to the heat diffusion plate is smaller than the number of thin wires vertical thereto in item (5) or (6);

(8) the continuous rectangular plate-shaped member is more dense at the central portion thereof than at the opposite ends thereof in item (5);

(9) the swirl-shaped plate member is more dense at the central portion thereof than at the periphery thereof in item (6);

(10) an LSI package to which an LSI package cooling heat sink including fins attached to a heat diffusion plate is mounted, wherein the fins are composed of a plate-shaped net and an end of the plate-shaped net is joined to the heat diffusion plate;

(11) an LSI package to which an LSI package cooling heat sink including fins attached to a heat diffusion plate is mounted, wherein the heat diffusion plate constitutes a portion of the LSI package, the fins are composed of a plate-shaped net and an end of the plate-shaped net is joined to the heat diffusion plate.

(12) the plate-shaped net is bent to form continuous rectangular shapes in item (10);

(13) the plate-shaped net is bent to form continuously repeated triangular shapes on the heat diffusion plate in item (10);

(14) the plate-shaped net is formed to a swirl-shape in item (10);

(15) a manufacturing method comprising the steps of continuously bending by plastically working a plate-shaped net formed by knitting thin wires at the particular portions or entire portion thereof, and soldering or brazing the bent net to a heat diffusion plate;

(16) the heat diffusion plate is previously plated in item (15);

(17) the soldering and the brazing are carried out by using solder and filler metal in item (15), respectively;

(18) the thin wires are composed of aluminium and the heat diffusion plate is composed of an aluminium plate with one side clad by aluminium-silicon alloy in item (15);

(19) the thin wires are bent by plastic working and are simultaneously pressure-bonded (that is, pressure welded) to the heat diffusion plate in item (15); and

(20) the thin wires are bent to continuous rectangular shapes by plastic working and pressure-welded (i.e. pressure-bonded) to the heat diffusion plate and then each rectangular upper end is removed in item (15).

As described above, since the net composed of the longitudinal thin wires intersecting with the horizontal thin wires is used, the fins of the heat sink composed of the thin wires are not positionally dislocated and further the rigidity of the fins is greatly improved by forming the same as a three-dimensional structure.

As a result, no variation is caused in the cooling performances of respective products and thus the reliability of the products is increased.

Moreover, since the adjacent thin wires of the net are composed of the longitudinal thin wires intersecting with the horizontal thin wires, the phases of the irregular portions formed by the thin wires are formed at a different position and a wind strikes against the irregular portions with the different phases and thus the LSI package cooling heat sink is provided with a high heat transfer performance.

Further, since the heat sink has a sufficient rigidity even when the net is composed of a wire with a small diameter, no limit is imposed on the diameter of the thin wire and the net can be processed by plastic working, and thus a freedom of design can be increased to thereby improve the performance of the heat sink.

When the number of the thin wires parallel to the heat diffusion plate is smaller than the number of thin wires vertical thereto, the pressure loss of a cooling wind can be lowered while keeping the heat transfer from the heat diffusion plate effected by the vertical thin wires, and thus the size of cooling fins can be reduced and noise can be also lowered.

Further, since the heat sink is rigidly arranged, a joining surface has a good dimensional accuracy and the intimately contacting property of the joining surface is improved with no improperly joined portion. As a result, a heat sink excellent in a cooling performance with a minimum heat resistance can be provided.

When the swirl-shaped heat sink is formed more densely at the central portion thereof than at the periphery thereof, the heat diffusion plate has a uniformly distributed temperature when it is cooled and thus a cooling performance is improved.

Since the net has a strong rigidity, it can be continuously bent by plastic working and brazed or pressure welded to the heat diffusion plate by using solder or the like. Therefore, a method of manufacturing an LSI package cooling heat sink made in a short period of time and excellent in mass-production can be provided.

DESCRIPTION OF PREFERRED EMBODIMENTS

An embodiment of the present invention will be described below with reference to the drawings.

Figure 4:
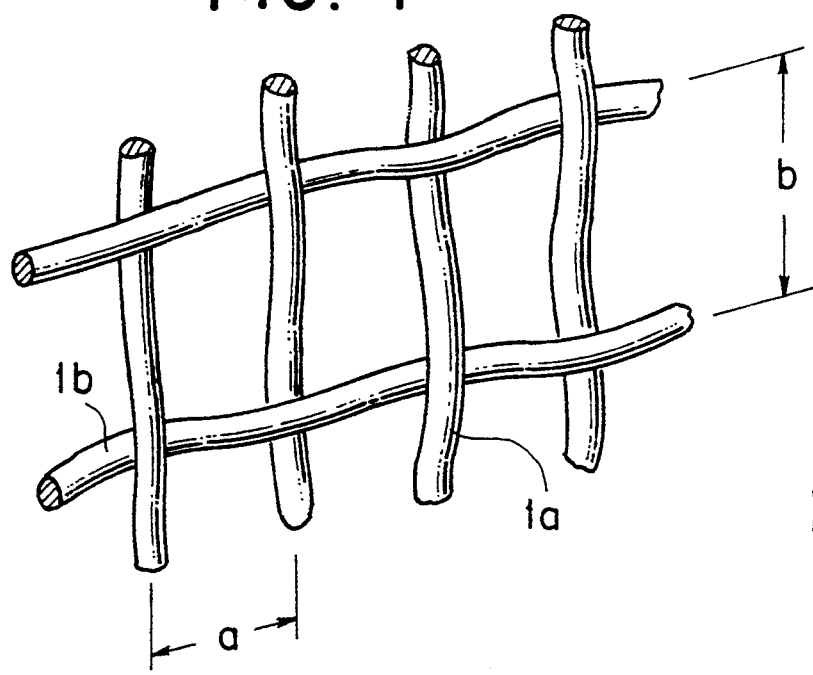
FIG. 4 is a perspective view showing the intersecting state of the thin wires of a net.
Figure 5:
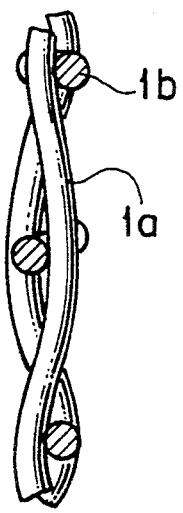
FIG. 5 is a cross sectional view of the net shown in FIG. 4.

As noted above, FIG. 1 shows an example of an LSI package cooling heat sink mounted on an LSI package; FIG. 2 is a cross sectional view thereof; and FIGS. 4 and 5 show the structure of a net 4.

The LSI package cooling heat sink of this embodiment is arranged such that a swirl-shaped net 4 having a height of 10 mm and composed of a thin wire with a diameter of 0.25 mm is mounted on a heat diffusion plate 10 constituting a portion of the LSI package 2.

Figure 1:
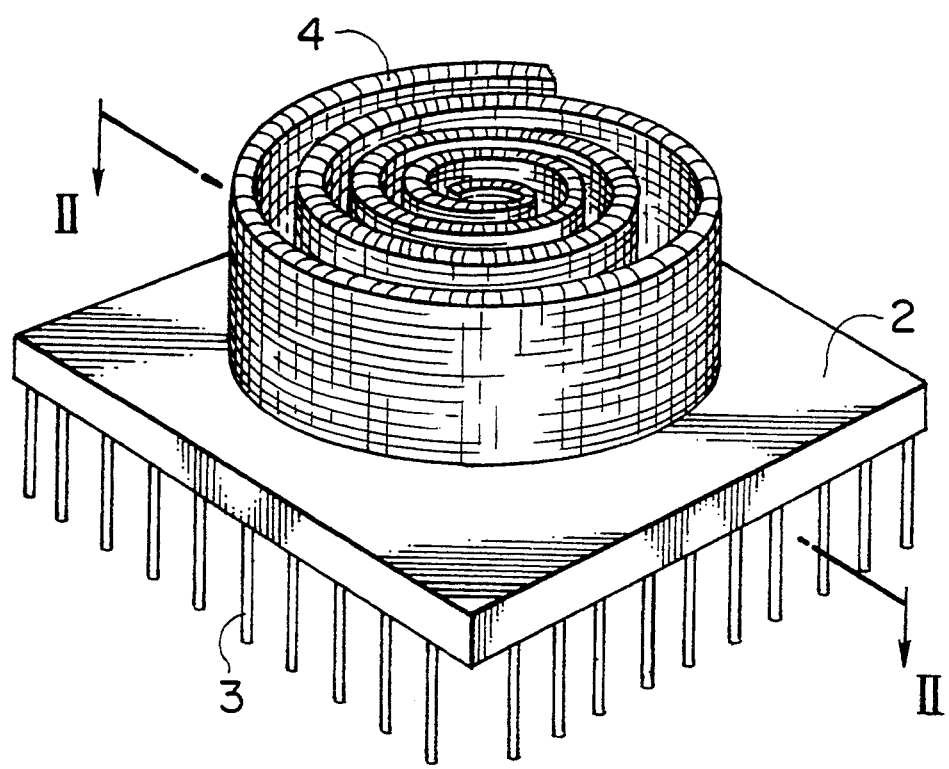
FIG. 1 is a perspective view of an LSI package to which a swirl-shaped LSI package cooling heat sink according to an embodiment of the present invention is mounted.
Figure 2:
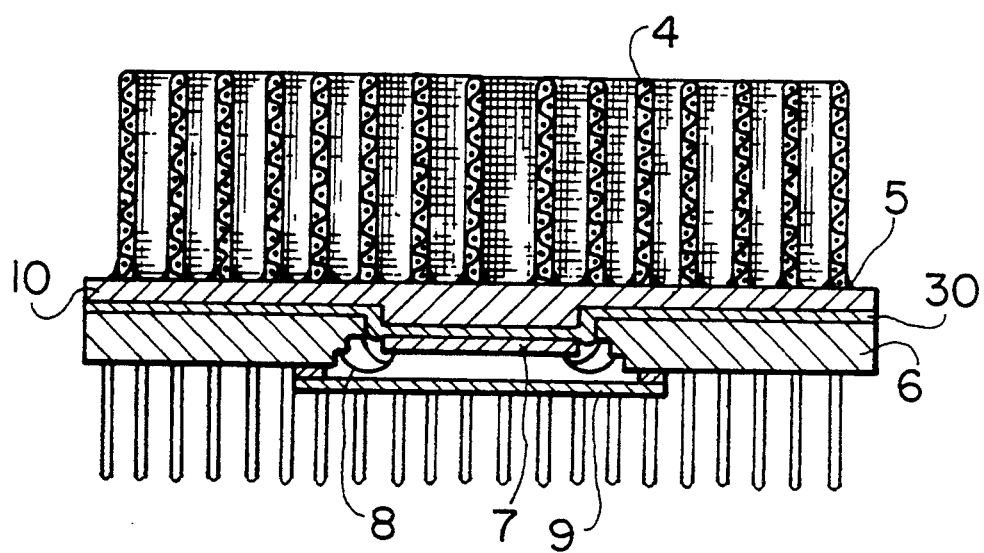
FIG. 2 is a cross sectional view of the LSI package shown in FIG. 1.

Although FIGS. 1 and 2 show an example of the net which is bent and formed to the swirl-shape, the net may be formed to the swirl-shape without being bent. When use is made of a net composed of longitudinal thin wires the number of which is different from that of horizontal thin wires, the net is disposed such that the number of the thin wires vertical to the heat diffusion plate is larger than that of the thin wires parallel thereto.

Further, the net may be fixed to the heat diffusion plate by bending the end of the thin wires vertical to the diffusion plate and joining the same to the plate.

As shown in FIG. 2, the LSI package cooling heat sink is arranged such that the net 4 rectangularly bent is formed to the swirl-shape and joined to the heat diffusion plate 10 constituting a portion of the package by solder 5. The LSI package is composed of a wiring substrate 6, LSI chip 7, wire 8, cap 9 and the heat diffusion plate 10 and the like and the heat diffusion plate 10 is joined to the LSI chip 7 and wiring substrate 6 by elastomer. The LSI chip 7 is electrically connected to pins 3 through the wire 8 and further the LSI chip 7 and wire 8 are protected by the cap 9. Further, the heat diffusion plate 10 serves to transfer the heat generated by the LSI chip 7 to thin wire 1 constituting the net 4.

Figure 3:
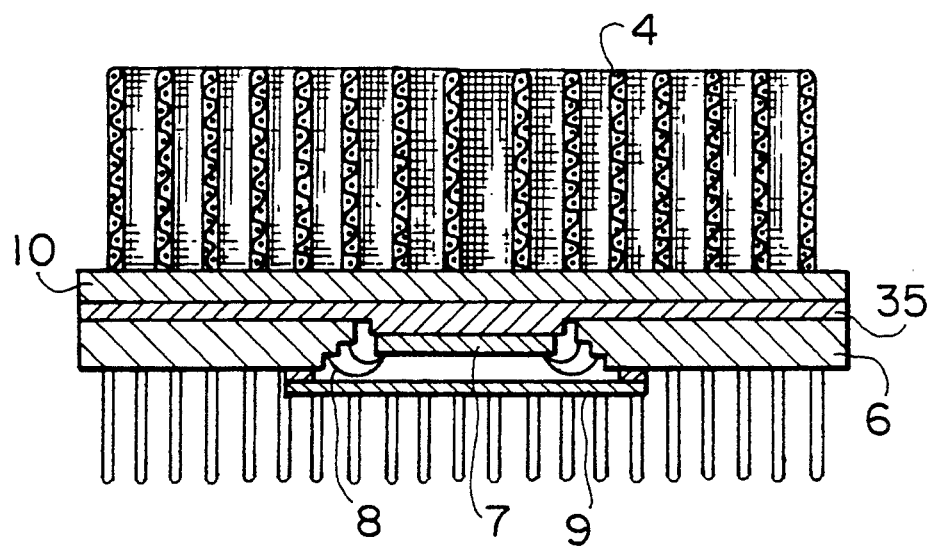
FIG. 3 is a cross sectional view of an LSI package to which the swirl-shaped LSI cooling heat sink according to the embodiment of the present invention is mounted.

The LSI package cooling heat sink may be arranged such that the heat diffusion plate 10 constitutes a part of the LSI package, or such that the heat diffusion plate 10 is disposed on the base 35 of the LSI package independently as shown in FIG. 3. In this arrangement, solders having a different melting temperature may be used to join the net 4 to the heat diffusion plate 10 and the heat diffusion plate 10 to the base 35.

As shown in FIG. 4, the net 4 constituting the heat sink is composed of thin wires $1b$ parallel to the heat diffusion plate (hereinafter, referred to as horizontal wires) having intervals b larger than the intervals of thin wires $1a$ vertical to the heat diffusion plate (hereinafter, referred to as longitudinal wires) (a=1 mm, b=2 mm) and the horizontal wires are alternately meshed with the longitudinal wires.

The LSI package cooling heat sink was formed to a square of 60×60 mm and the swirl-shaped heat sink is more densely formed at the central portion thereof than at the periphery thereof. A thermocouple was attached to the center of each of imaginary squares obtained by imaginarily dividing the heat diffusion plate 10 of the LSI package cooling heat sink to nine square portions (that is, the heat diffusion plate was imaginarily divided horizontally and longitudinally to three equiarea portions) to thereby measure the temperature of the heat diffusion plate 10.

As a result, it was found that the heat diffusion plate had a substantially uniform temperature. This is because heat resistance was reduced by increasing the heat radiating area of the heat sink just above a heat generating portion so that the heat diffusion plate had a substantially uniform temperature.

In the swirl-shaped LSI package cooling heat sink such as this embodiment, the swirl shape thereof is formed to follow a swirling flow of air generated by a cooling wind and thus the swirl-shape has some contributions for the improvement of a heat transfer coefficient.

Figure 6:
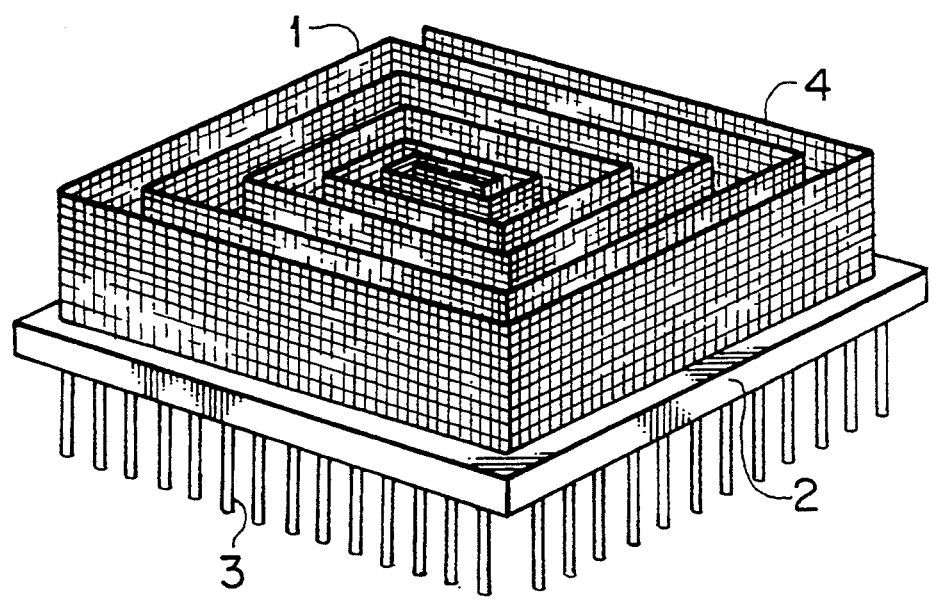
FIG. 6 is a perspective view of an LSI package to which a swirl-shaped square LSI package cooling heat sink according to an embodiment of the present invention is mounted.

A similar effect also can be obtained by a swirl-shaped square LSI package cooling heat sink shown in FIG. 6.

As described above, the LSI package cooling heat sink having an excellent cooling effect and arranged rigidly can be obtained in such a manner that the net is formed to a swirl-shape and joined to the heat diffusion plate.

Figure 7:
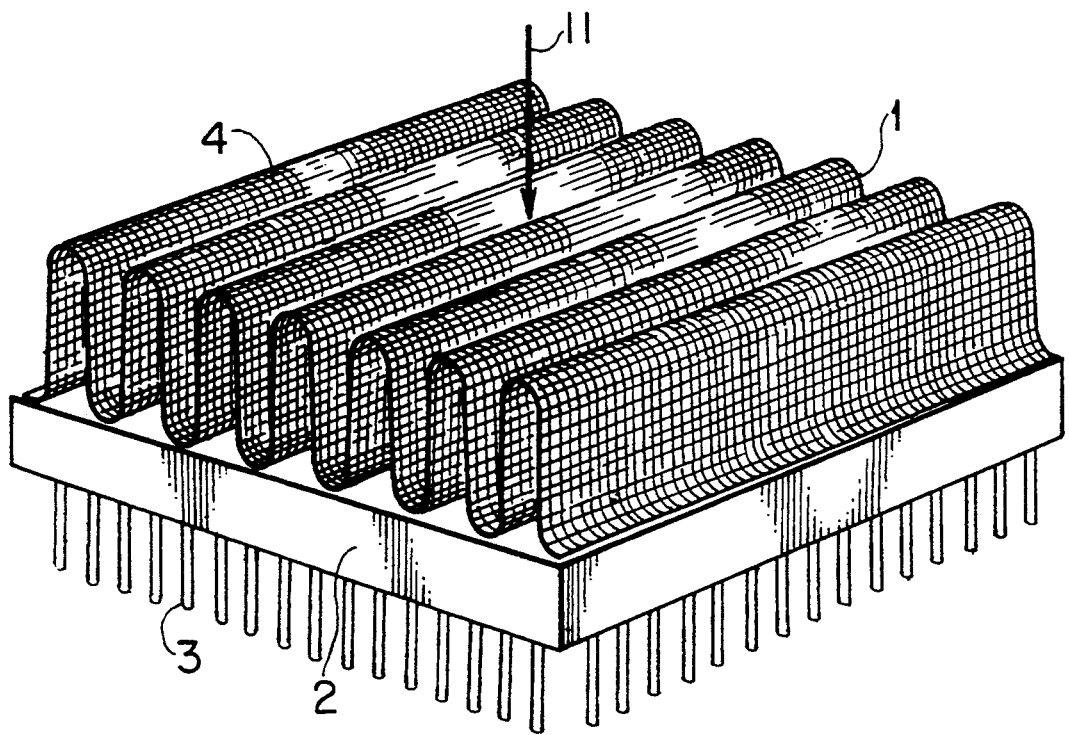
FIG. 7 is a perspective view of an LSI package to which a corrugated LSI package cooling heat sink according to an embodiment of the present invention is mounted.

Further, a similar effect can be obtained by a corrugated LSI package cooling heat sink shown in FIG. 7. For example, the heat radiating area of the heat sink just above the heat generating portion can be increased by narrowing the bending intervals of the net 4 just above the heat generating portion.

Further, the net may be formed to repeated triangular shapes on the heat diffusion plate in place of the net formed to the rectangular shape, as shown in FIG. 7.

The rigidity of the swirl-shaped net 4 was evaluated from the relationship between a load and an amount of deformation. As a result, even when a load of 5 Kgf was applied onto the upper surface of the swirl-shaped net 4, the net 4 was only slightly deformed in an amount of deformation (a dent amount) of about 0.5 mm.

The action of the net 4 composed of the longitudinal wires intersecting with the horizontal wires will be described below. As shown in FIG. 5, the adjacent longitudinal or horizontal wires of the net 4 are not parallel to each other and repeat fine irregular portions with dislocated phases. This arrangement is very effective to the improvement of the heat transfer performance of the heat sink.

That is, when the respective thin wires 1 constituting the heat sink are disposed in parallel to each other, these thin wires 1 are disposed on the same plane with respect to the direction in which fluid flows, and thus a dead water region (exfoliation region) formed at the rear side of the thin wires located on the upstream side directly affects the thin wires located on the downstream side, and thus there is a possibility that the heat transfer performance of the thin wires on the downstream side is greatly damaged.

On the other hand, since the adjacent thin wires of the LSI package cooling heat sink composed of the longitudinal thin wires and horizontal thin wires intersected and knitted with one another are not disposed in parallel to each other, the thin wires located on the downstream side are scarcely affected directly by the dead water region of the thin wires located on the upstream side.

As a result, a very high heat transfer performance can be obtained without damaging the heat transfer performance of each wire.

Next, the result of the study for the relationship between a wind speed Q and a pressure loss $\Delta P$ obtained by using an LSI package cooling heat sink configured to the same shape as that shown in FIG. 7 will be described below. Note, in this experiment, there are used LSI package cooling heat sinks one of which employs a net 4 arranged such that the intervals b of horizontal wires are larger than the intervals of longitudinal wires (b>a) as shown in FIG. 4 and another of which uses another net 4 arranged such that the intervals b of horizontal wires are equal to the intervals of longitudinal wires (b=a).

A cooling wind 11 was made to flow from just above the corrugated net 4 as shown in FIG. 7.

Figure 8:
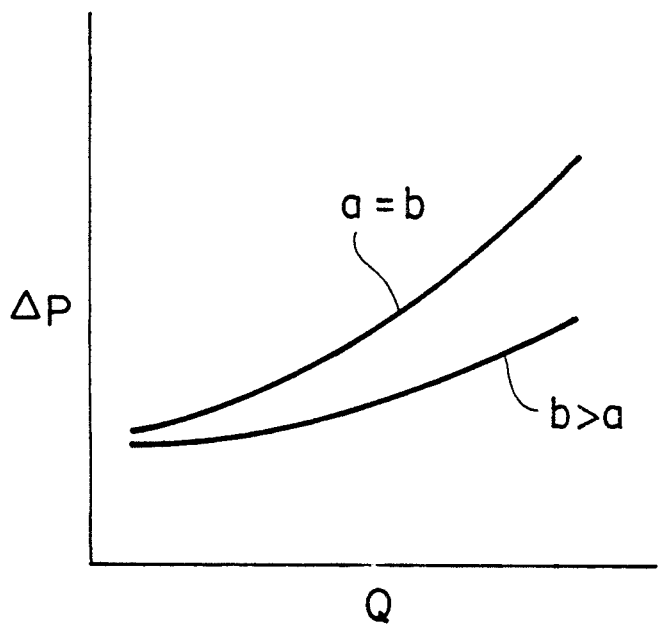
FIG. 8 is a diagram showing the relationship between a wind speed and a pressure loss when a wind is supplied to the heat sink shown in FIG. 7.

FIG. 8 shows the relationship between the wind speed Q and the pressure loss ΔP. As apparent from FIG. 8, the pressure loss ΔP is increased with the increase of the wind speed Q. Further, the pressure loss ΔP of the heat sink with the intervals b of horizontal wires larger than the intervals a of longitudinal wires is smaller than that of the heat sink with the intervals b of the horizontal wires equal to the intervals a of the longitudinal wires.

From the aforesaid, it can be said that when the intervals b of the horizontal wires are made larger than the intervals a of the longitudinal wires, the pressure loss ΔP can be lowered. When, however, the intervals b are excessively increased, the rigidity of the net 4 may be decreased.

As described above, since the pressure loss ΔP can be lowered by making the intervals of the horizontal wires larger than those of the longitudinal wires, a wind speed can be lowered, that is, a noise can be lowered. The size of a fan can also be reduced.

Next, a study was made of the joining (bonding) property of an LSI package cooling heat sink configured to the same shape as that shown in FIG. 7, the heat sink including a net 4 composed of an aluminium material and a heat diffusion plate 10 made of an aluminium plate with one side clad by aluminium-silicon alloy.

The heat sink can be made in such a manner that the heat diffusion plate 10 is laminated with the corrugated net 4 and joined thereto by being heated under a low pressure applied thereto so that the laminated surfaces to be bonded come into intimate contact with each other. A weight, spring or the like is used as a jig for the intimate contact of the joining surfaces of the net 4 and heat diffusion plate 10. When the Corrugated net shown in FIG. 7 is to be intimately contacted, a multi-fin jig with a pitch corresponding to the bending pitch of the corrugated net may be preferably used.

The heat diffusion plate 10 was made of an aluminium plate member (A3003) with a thickness of 1.0 mm and a brazing material layer composed of aluminium-silicon alloy (eutectic alloy) and having a thickness of 100 μm was disposed on the surface of the heat diffusion plate 10 to be joined to the aluminium net 4.

The net 4 and heat diffusion plate 10 were perfectly washed and degreased by using acetone. After the washing, the corrugated net 4 was placed on the aluminium-silicon surface of the heat diffusion plate 10 and then disposed in a heating furnace.

Thereafter, the net 4 and heat diffusion plate 10 were heated in vacuum of about $10^{-3}$ Pa under the heating conditions that they were rapidly heated up to 540° C. and then gradually heated to 595° C. which was higher than the melting point of the aluminium-silicon alloy (577° C.) so that they could be uniformly heated as a whole and thus the net 4 was joined to the heat diffusion plate 10.

When the cross section of the portion where the heat diffusion plate 10 was joined to the net 4 was observed after they had been joined, no void was found and it was confirmed that they were joined well. Further, when the portion where an LSI package cooling heat sink joined by the same method as that of this embodiment was examined by an ultrasonic flaw detector, no void was found and the heat sink was joined well.

Further, the joining property of an LSI package cooling heat sink including a net 4 and heat diffusion plate 10 each composed of copper and configured to the same shape as that shown in FIG. 7 was also examined.

The net 4 and heat diffusion plate 10 were washed and placed on a hot plate heated to 230° C. and then joined to each other by using Pb—Sn eutectic solder.

When the cross section of the portion where the heat diffusion plate 10 was joined to the net 4 was observed after they had been joined, no void was found and it was confirmed that they were joined well.

Further, when an LSI package cooling heat sink has a net 4 made of aluminium and a heat diffusion plate 10 made of copper (Cu), the net 4 was joined to the heat diffusion plate 10. With this arrangement of the materials, since the heat diffusion plate 10 can not be directly joined to the net 4 composed of aluminium, the surface of the aluminium net 4 was degreased first and then the surface thereof was plated with Ni (5 μm)+Cu (5 μm).

Thereafter, the net 4 and heat diffusion plate 10 were placed on a hot plate heated to 230° C. and joined to each other by using Pb—Sn eutectic solder.

When the cross section of the portion where the heat diffusion plate 10 was joined to the net 4 was observed after they had been joined, no void was found and it was confirmed that they were joined well.

Almost no difference was admitted among the cooling performances of these LSI package cooling heat sinks.

Figure 9A:
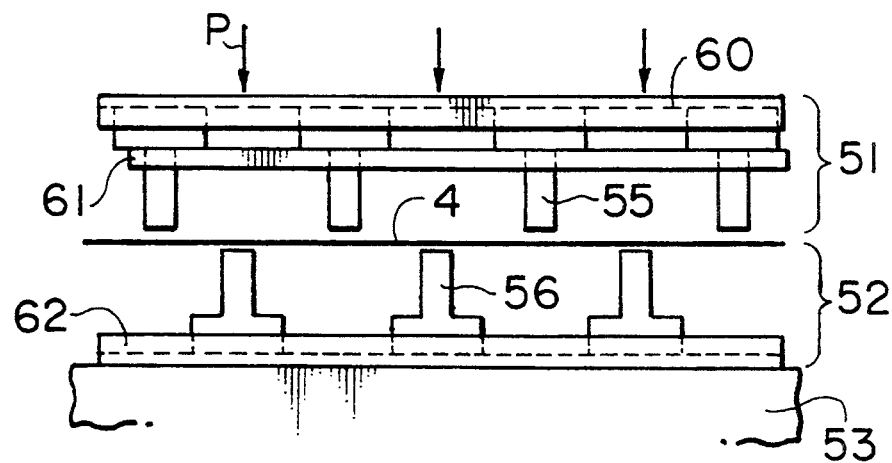
FIGS. 9A, 9B and 9C are drawings explaining a method of corrugation.
Figure 9B:
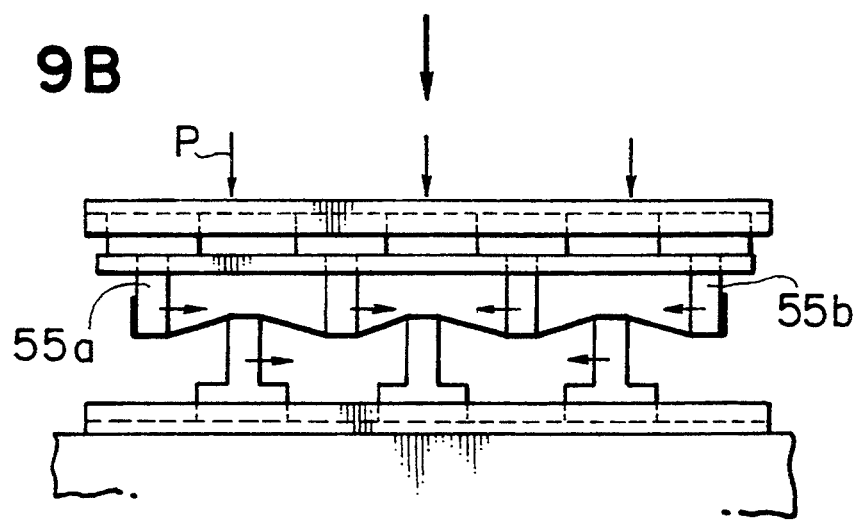
Figure 9C:
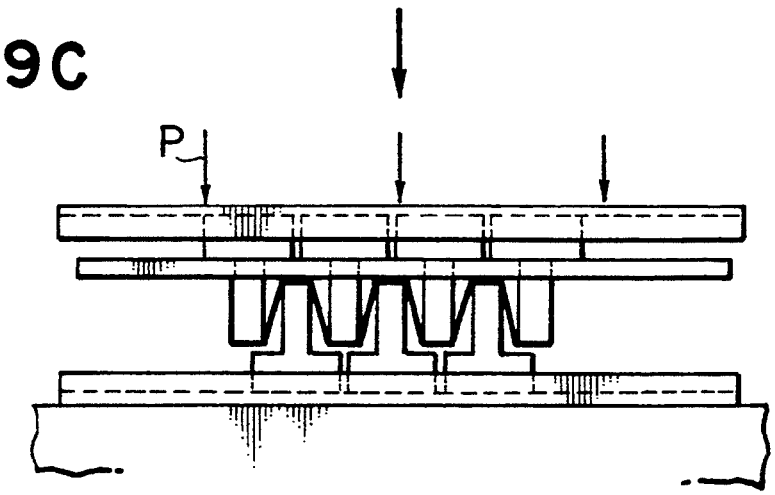

Next, a method of bending and corrugating a net will be described with reference to FIGS. 9A, 9B and 9C. FIGS. 9A, 9B and 9C sequentially show the steps of a corrugating process. In these Figures, an upper metal mold 51 and lower metal mold 52 are placed on a table 53 and other parts other than the above are omitted. The upper metal mold 51 has guides 60 and 61 and upper dies 55. The upper dies 55 can be slid in the directions of arrows shown in FIG. 9B along a groove (not shown) defined to the guide 60. Further, the lower metal mold comprises a guide 62 and lower dies 56. The lower dies 56 can be slid in the directions of arrows shown in FIG. 9B along a groove (not shown) defined in the guide 62.

The net was bent in such a manner that first the upper metal mold 51 was moved upward to form a gap between the upper metal mold 51 and the lower metal mold 52 and the net 4 was inserted into the gap, as shown in FIG. 9A. Next, the opposite ends of the net 4 were fixed to the upper dies 55a and 55b located at the opposite sides of upper dies 55. At this time, a spacer was inserted between a plurality of the upper dies 55 and a plurality of a lower dies 56 to prevent the offset of the respective dies and to create a fixed gap. A hard sponge was used as the spacer. Thereafter, a load was applied to both metal molds and then removed therefrom at the time when the net 4 was slightly bent as shown in FIG. 9B and then the net 4 was further worked up to the state shown in FIG. 9C by removing the spacer. The load was not applied at one time but repeatedly applied before the net was formed to a final shape and the movement of the upper and lower dies 55 and 56 was confirmed during the application of the load.

Next, a joining method effected by using Pb—Sn eutectic solder was examined.

A net 4 was mounted to a metal mold, which is used for plastic working, having teeth formed to have a shape corresponding to the corrugated shape and a heater embedded in the terminal end of each of the teeth, and the net 4 was moved on a heat diffusion plate 10. A thin plate of the Pb—Sn eutectic solder was inserted between the heat diffusion plate 10 and the corrugated net 4, and the portion of the net 4 in contact with the heat diffusion plate 10 was joined thereto by being heated by the heater at the extreme end of each tooth of the metal mold while the net 4 was pressed against the heat diffusion plate 10.

Note, the surface of the metal mold was covered with fluororesin to prevent the wetting of the solder.

When the cross section of the portion where the heat diffusion plate 10 was joined to the net 4 was observed after they had been joined, no void was found and it was confirmed that they were joined well.

Further, it was also confirmed that the corrugated net 4 was joined well to the heat diffusion plate 10 even in such another manner that, after the Pb—Sn eutectic solder was inserted therebetween, the portion where they come into contact with each other was directly heated by making electric current flow therebetween.

The LSI package cooling heat sink could be made in a short time by the above method.

Figure 10:
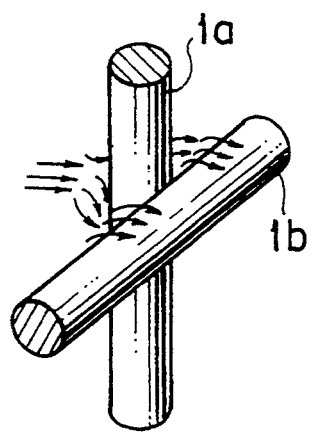
FIG. 10 is a drawing explaining the flow of a cooling wind.

FIG. 10 shows the flowing state of a cooling wind at the intersecting portion of thin wires constituting a net.

As apparent from FIG. 10, the cooling wind strikes against a thin wire 1a and becomes a turbulent flow which further strikes against a thin wire 1b and becomes an additional turbulent flow.

In general, a heat transfer coefficient is more improved in the turbulent flow than in a laminar flow and thus the heat transfer coefficient of the thin wire 1b is greatly improved so that the heat efficiency of the thin wire 1b is increased.

Figure 11:
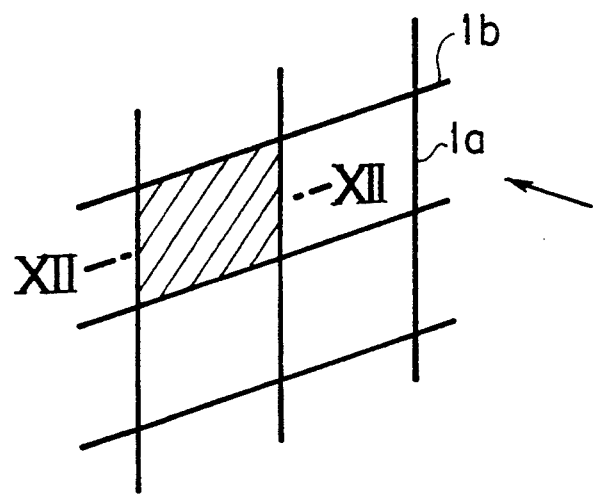
FIG. 11 is a drawing explaining the flow of a cooling wind.
Figure 12:
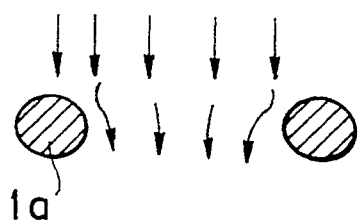
FIG. 12 is a cross sectional view taken along the line A—A of FIG. 11.
Figure 13:
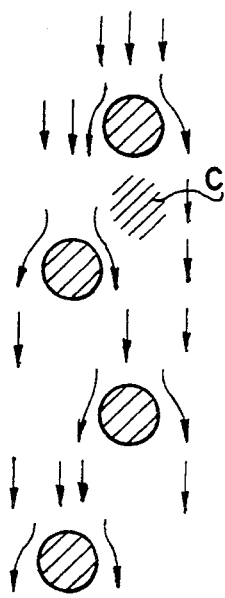
FIG. 13 is a diagram explaining the flow of a cooling wind.

FIGS. 11, 12 and 13 show a cooling wind flowing through a meshed portion. Note, FIG. 12 is a cross sectional view of FIG. 11 taken along the line XII—XII thereof.

As shown in these figures, a cooling wind flowing through the portion surrounded by the thin wires 1a and 1b is made to be a turbulent flow by the thin wires 1a and 1b. As a result, the cooling wind has an increased speed, and a heat transfer coefficient is improved and thus a performance is also improved. A reference character c in FIG. 13 designates a dead water region.

Heat can be effectively transferred through the portion where a net formed to a corrugated-shape or swirl-shape is joined to a heat diffusion plate by a joining method such as brazing (including soldering), diffusing junction, pressure welding or the like effectively transfers heat as a whole.

The net is preferably made of a material having a high heat transfer coefficient and thus silver, aluminium, gold and copper are most suitable. Further, pure metal is more advantageous than alloy because it has a higher heat transfer coefficient.

Figure 14:
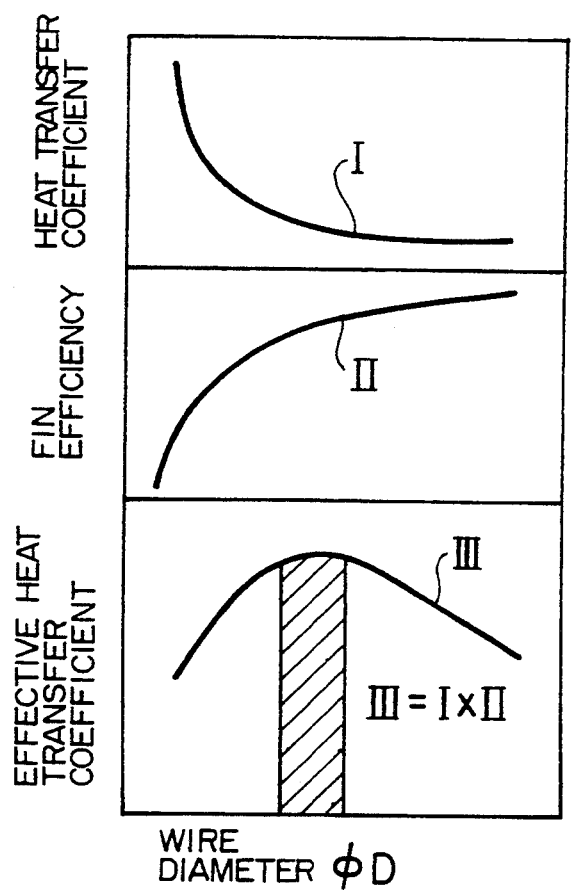
FIG. 14 is a diagram explaining heat transfer characteristics.
Figure 15A:
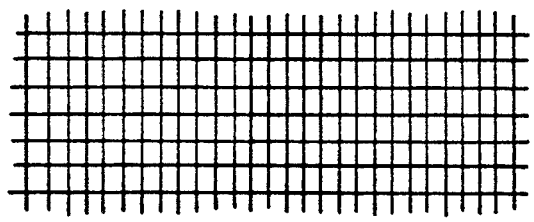
FIGS. 15A to 15H are diagrams showing patterns of a net.
Figure 15B:
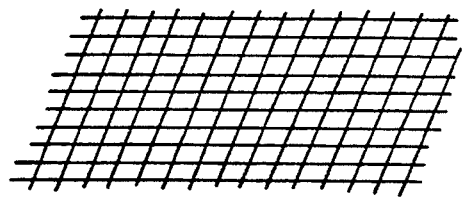
Figure 15C:
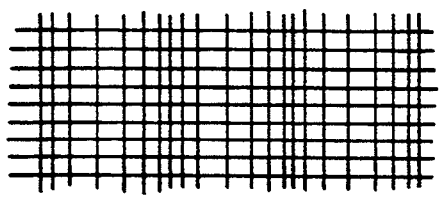
Figure 15D:
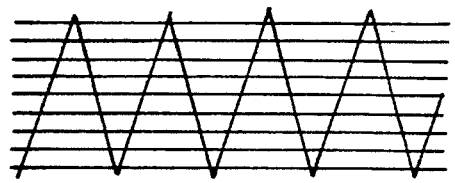
Figure 15E:
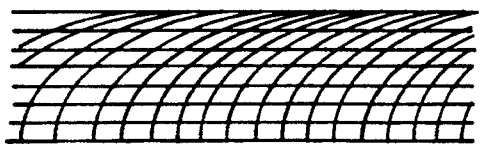
Figure 15F:
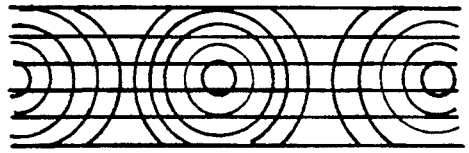
Figure 15G:
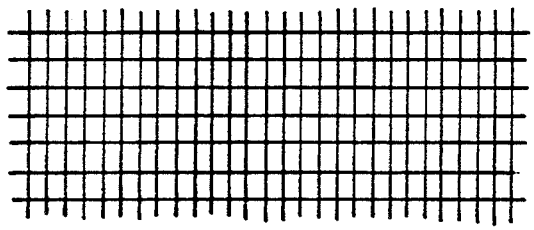
Figure 15H:
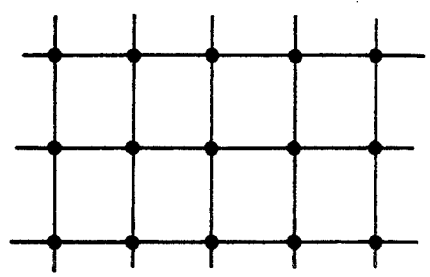

FIG. 14 shows the relationship between a wire diameter $\Phi D$ and various characteristics. A curve I shows the relationship between the wire diameter $\Phi D$ and a heat transfer coefficient, a curve II shows the relationship between the wire diameter $\Phi D$ and a fin efficiency, and curve III shows the relationship between the wire diameter $\Phi D$ and an effective heat transfer coefficient, respectively. More specifically, these curves show the relationship between the wire diameter $\Phi D$ and the performance of a heat sink.

The effective heat transfer coefficient is determined by the product of the heat transfer coefficient and fin efficiency. Therefore, an optimum wire diameter of the net preferably has a size by which the value of the curve III is maximized.

A net member used in the present invention is not limited to the above examples and includes variations shown, for example, in FIG. 15. Further, the arrangement of the net member is not limited to the horizontal thin wires intersecting with the vertical thin wires and oblique thin wires may be added to the horizontal wires and vertical wires.

Although the intersecting points of a net having the pattern (h) shown in FIG. 15 are soldered, a net having press welded intersecting points may be employed in place of the net with the soldered intersecting points.

Further, the net to be joined to the heat diffusion plate may be formed of a plurality of net plate members or a combination with other fins such as for example thin wire fins in addition to a continuous rectangular net or swirl-shaped net.

As apparent from the above description, since the LSI package cooling heat sink according to the present invention uses the net formed of the longitudinal thin wires intersecting with the horizontal thin wires, the phases of the adjacent thin wires of the net are located at a different position, and thus the net is very effective to produce a turbulent flow in a cooling wind and as a result a high heat transfer performance can be obtained.

Further, since a pressure loss of a cooling wind is not lowered, the size of cooling fins can be reduced and noise produced thereby can be lowered.

Further, since the swirl-shaped heat sink is more densely formed at the central portion thereof than at the periphery thereof, the temperature of the heat diffusion plate is uniformly distributed when cooled and thus a cooling performance is improved.

Moreover, since the net has large rigidity, it can be continuously bent by plastic working and brazed (including soldering) or press welded to a heat diffusion plate.

Therefore, it is possible to provide a method of manufacturing an LSI package cooling heat sink which can be made in a short time and which is excellent in mass-production.

Further, the LSI package of the present invention can effectively remove the heat generated by LSI chips through the heat sink and operate the LSI chips while keeping them at a proper operating temperature.

What is claimed is:

1. An LSI package cooling heat sink of a type in which a fluid is made to flow through the heat sink adapted to be mounted on an LSI package, said heat sink comprising fins attached to a heat diffusion plate, said fins being formed of a net repeatedly bent with predetermined width so that bent portions of the net are spaced apart from each other with predetermined interval without contacting each other, one of width-wise ends of the bent portions being joined to said heat diffusion plate, said net being formed of first thin wires and second thin wires both of which first and second thin wires are intersecting with each other, each of said first thin wires being disposed in parallel to said heat diffusion plate, each of said first thin wires being spaced apart, from adjacent first thin wires with a first space, each of said second thin wires intersecting with said first thin wires being spaced apart from adjacent second thin wires with a second space smaller than said first space.

2. An LSI package cooling heat sink according to claim 1, wherein said fins are formed of the net bent with predetermined width so that the net has continuous, repeated rectangular shapes.

3. An LSI package cooling heat sink according to claim 1, wherein said fins are formed of the net bent with predetermined width so that the net has continuous, repeated triangular shapes.

4. An LSI package cooling heat sink according to claim 1, wherein the other of said width-wise ends of the bent portions opposite said one end joined to said diffusion plate is a free end which permits flow of said fluid through said fin in a direction toward and away from said heat diffusion plate.

5. An LSI package comprising an LSI package cooling heat sink having fins attached to a heat diffusion plate, said fins being formed of a net repeatedly bent with predetermined width so that bent portions of the net are spaced apart from each other with predetermined interval without contacting each other, one of width-wise ends of the bent portions being joined to said heat diffusion plate, said net being formed of first thin wires and second thin wires both of which first and second thin wires are intersecting with each other, each of said first thin wires being disposed in parallel to said heat diffusion plate, each of said first thin wires being spaced apart from adjacent first thin wires with a first space, each of said second thin wires intersecting with said first thin wires being spaced apart from adjacent second thin wires with a second space smaller than said first space.

6. An LSI package according to claim 5, wherein the other of said width-wise ends of the bent portions opposite said one end joined to said diffusion plate is a free end which permits flow of said fluid through said fin in a direction toward and away from said heat diffusion plate.

7. An LSI package comprising an LSI package cooling heat sink having fins attached to a heat diffusion plate, said heat diffusion plate being made to constitute a portion of said LSI package, said fins being formed of a net repeatedly bent with predetermined width so that bent portions of the net are spaced apart from each other with predetermined interval without contacting each other, one of width-wise ends of the bent portions being joined to said heat diffusion plate, said net being formed of first thin wires and second thin wires both of which first and second thin wires are intersecting with each other, each of said first thin wires being disposed in parallel to said heat diffusion plate, each of said first thin wires being spaced apart from adjacent first thin wires with a first space, each of said second thin wires intersecting with said first thin wires being spaced apart from adjacent second thin wires with a second space smaller than said first space.

8. An LSI package according to claim 5, wherein said fins are formed of the net bent with predetermined width so that the net has continuous, repeated rectangular shapes.

9. An LSI package according to claim 5, wherein said fins are formed of the net bent with predetermined width so that the net has continuous, repeated triangular shapes.

10. An LSI package according to claim 7, wherein the other of said width-wise ends of the bent portions opposite said one end joined to said diffusion plate is a free end which permits flow of said fluid through said fin in a direction toward and away from said heat diffusion plate.

* * * * *